(12) United States Patent
Tamaso et al.

(10) Patent No.: US 8,883,619 B2
(45) Date of Patent: Nov. 11, 2014

(54) METHOD FOR MANUFACTURING SEMICONDUCTOR DEVICE

(75) Inventors: Hideto Tamaso, Osaka (JP); Hiromu Shiomi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 339 days.

(21) Appl. No.: 13/298,861

(22) Filed: Nov. 17, 2011

(65) Prior Publication Data

US 2012/0129326 A1 May 24, 2012

Related U.S. Application Data

(60) Provisional application No. 61/415,072, filed on Nov. 18, 2010.

(30) Foreign Application Priority Data

Nov. 18, 2010 (JP) ................................. 2010-257370

(51) Int. Cl.
*H01L 21/425* (2006.01)
*H01L 29/66* (2006.01)
*H01L 21/04* (2006.01)

(52) U.S. Cl.
CPC ........ *H01L 29/66068* (2013.01); *H01L 21/046* (2013.01)
USPC ....... 438/514; 438/758; 438/14; 257/E21.334

(58) Field of Classification Search
CPC ......................... H01L 29/66068; H01L 21/046
USPC ............. 438/14–18, 758, 759, 761, 778–780, 438/785–787, 791
See application file for complete search history.

(56) References Cited

U.S. PATENT DOCUMENTS

| 5,877,094 | A | 3/1999 | Egley et al. |
| 6,238,935 | B1 | 5/2001 | Egley et al. |
| 7,115,955 | B2 * | 10/2006 | Messenger et al. ........... 257/369 |
| 8,395,163 | B2 * | 3/2013 | Tamaso .......................... 257/77 |
| 2006/0027833 | A1 * | 2/2006 | Tanimoto ....................... 257/173 |
| 2006/0097266 | A1 | 5/2006 | Nishino et al. |
| 2007/0023781 | A1 * | 2/2007 | Mizukami et al. ............ 257/192 |
| 2008/0090383 | A1 | 4/2008 | Nakamura et al. |

(Continued)

FOREIGN PATENT DOCUMENTS

| JP | H07-283383 A | 10/1995 |
| JP | 10-340833 A | 12/1998 |

(Continued)

OTHER PUBLICATIONS

Notice of Grounds of Rejection in Japanese Patent Application No. 2010-257370, dated Mar. 11, 2014.

(Continued)

*Primary Examiner* — Leonard Chang
(74) *Attorney, Agent, or Firm* — Venable LLP; Michael A. Sartori; George L. Howarah

(57) ABSTRACT

A method for manufacturing a semiconductor device includes the steps of: preparing a substrate made of silicon carbide; forming, on one main surface of the substrate, a detection film having a light transmittance different from that of silicon carbide; confirming presence of the substrate by applying light to the detection film; and forming an active region in the substrate whose presence has been confirmed.

10 Claims, 9 Drawing Sheets

(56) References Cited

U.S. PATENT DOCUMENTS

2010/0276703 A1* 11/2010 Tanimoto .................... 257/77
2011/0203513 A1* 8/2011 Watanabe et al. ............ 117/54
2012/0007104 A1* 1/2012 Wada et al. .................. 257/77

FOREIGN PATENT DOCUMENTS

| JP | 11121315 A | * | 4/1999 |
|---|---|---|---|
| JP | 2004363515 A | * | 12/2004 |
| JP | 2005-239496 A | | 9/2005 |
| JP | 2005-532697 A | | 10/2005 |
| JP | 2007-201155 A | | 8/2007 |
| JP | 2007-281005 A | | 10/2007 |
| JP | 2010-103229 A | | 5/2010 |
| WO | WO 2009128419 A1 | * | 10/2009 |

OTHER PUBLICATIONS

Decision to Grant Patent in Japanese Patent Application No. 2010-257370, mailed Sep. 16, 2014.

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device, more particularly, a method for, manufacturing a semiconductor device using a silicon carbide substrate.

2. Description of the Background Art

In recent years, in order to achieve high breakdown voltage, low loss, and utilization of semiconductor devices under a high temperature environment, silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

An exemplary, known method for manufacturing such a semiconductor device adopting silicon carbide as its material is to form an epitaxial growth layer on a silicon carbide substrate, then introduce an impurity by means of ion implantation, form an electrode, and the like. In this way, a silicon carbide semiconductor device achieving a desired operation can be obtained (for example, see Japanese Patent Laying-Open No. 2010-103229).

However, the following problem can take place when adopting silicon carbide as a material for a semiconductor device. That is, a general manufacturing facility for semiconductor devices is configured to use a silicon substrate. For improved manufacturing efficiency, the substrate is usually conveyed and set automatically in each manufacturing process. Whether or not the substrate is set at a desired location in each manufacturing process is confirmed by, for example, applying light such as laser to the location in which the substrate is supposed to be set, and detecting interception or reflection of the light by the substrate by means of a sensor. Meanwhile, the silicon carbide substrate is greatly different from the silicon substrate in light transmittance and reflectance. More specifically, the silicon substrate has a low light transmittance, whereas the silicon carbide substrate is almost transparent and therefore has a significantly higher light transmittance than that of the silicon substrate.

Under such a circumstance, if the above-described general manufacturing facility is employed to manufacture a semiconductor device using a silicon carbide substrate, conveyance and setting of the silicon carbide substrate are not recognized correctly. This hinders automated conveyance and setting of the substrate. To address this, a light source or a sensor used for the recognition of substrate is changed to handle the silicon carbide substrate, thus overcoming the above-described problem. However, the recognition of substrate is required whenever a substrate is conveyed in the manufacturing facility for the semiconductor device. Hence, in order to accommodate the manufacturing facility to the silicon carbide substrate, the manufacturing facility needs to be modified drastically. This results in increased facility cost, which leads to increased manufacturing cost of the semiconductor device, disadvantageously.

SUMMARY OF THE INVENTION

The present invention is made in view of the foregoing problem, and has its object to provide a method for manufacturing a semiconductor device, whereby the facility cost can be prevented from being increased.

A method for manufacturing a semiconductor device in the present invention includes the steps of: preparing a substrate made of silicon carbide; forming, on one main surface of the substrate, a detection film having a light transmittance different from that of silicon carbide; confirming presence of the substrate by applying light to the detection film; and forming an active region in the substrate whose presence has been confirmed.

Here, the light applied to the detection film is not particularly limited but can be, for example, visible light having a wavelength of approximately 360 nm-830 nm or infrared light having a wavelength of approximately 830 nm-1.1 μm.

In the method for manufacturing the semiconductor device in the present invention, the detection film facilitating detection of the substrate is formed in the silicon carbide substrate to confirm the presence of the substrate, and the active region contributing to operations of the semiconductor device is formed in such a substrate. Thus, by forming the detection film on the silicon carbide substrate, the substrate can be readily detected in a general manufacturing facility, thereby preventing increase of facility cost involved in modification of the facility. It should be noted that the detection film may be formed to entirely or partially cover the one main surface of the substrate.

In the method for manufacturing the semiconductor device, the detection film formed in the step of forming the detection film may be made of silicon. Accordingly, the substrate can be readily detected in a general manufacturing facility handling a silicon substrate.

In the method for manufacturing the semiconductor device, the step of forming the active region may includes the steps of: introducing an impurity into the substrate by means of ion implantation; and activating the impurity by heating the substrate having the impurity introduced therein. The method for manufacturing the semiconductor device may further include the steps of: removing the detection film before the step of activating the impurity; and forming, on the one main surface of the substrate, a second detection film having a light transmittance different from that of silicon carbide after the step of activating the impurity.

The active region can be formed by ion implantation and activation annealing. In this case, the detection film made of silicon may be melted in the step of performing activation annealing requiring heating at a high temperature, thereby adversely affecting the manufacturing of the semiconductor device. Hence, as described above, the detection film may be removed before the activation annealing, and another detection film may be formed after completion of the activation annealing.

The method for manufacturing the semiconductor device may further include the step of forming an oxide film on/over the other main surface of the substrate after the step of forming the active region. The second detection film formed on the substrate, having the oxide film thus formed, in the step of forming the second detection film may be made of polysilicon.

In manufacturing a semiconductor device having a gate electrode and a gate insulating film, an oxide film to be a gate insulating film is formed and then a gate electrode made of polysilicon may be formed thereon. In this case, a film made of polysilicon is formed also on the main surface of the substrate opposite to the gate electrode (i.e., on the one main surface) to serve as the second detection film, thereby achieving a simplified manufacturing process.

In the method for manufacturing the semiconductor device, the detection film formed in the step of forming the detection film may be made of carbon. A film made of carbon is excellent in heat resistance and corrosion resistance, can be formed relatively inexpensively, and is therefore suitable as the detection film.

In the method for manufacturing the semiconductor device, the step of forming the detection film may include the steps of: forming an organic film on the one main surface of the substrate; and subjecting the organic film to heat treatment.

By employing such a step, the detection film made of carbon can be readily formed. More specifically, for example, a resist film is employed as the organic film, and is heated in an inert gas atmosphere such as nitrogen or argon for carbonization, thereby readily achieving formation of the detection film made of carbon.

The method for manufacturing the semiconductor device may further include the steps of: forming an oxide film on/over the other main surface of the substrate after the step of forming the active region; and forming, on the one main surface of the substrate, a second detection film having a light transmittance different from that of silicon carbide after the step of forming the oxide film.

In the case where the detection film made of carbon is employed, the detection film is removed by oxidation upon performing the step of forming the oxide film by oxidizing the substrate with the detection film remaining thereon. Hence, another detection film (second detection film) may be formed after the step of forming the oxide film as described above. It should be noted that the detection film formed before the step of forming the oxide film may be removed in advance prior to the step of forming the oxide film, but can be removed by the oxidation in the step of forming the oxide film. In this case, the manufacturing process of the semiconductor device can be simplified.

In the method for manufacturing the semiconductor device, the second detection film formed in the step of forming the second detection film may be made of polysilicon.

In manufacturing a semiconductor device having a gate electrode and a gate insulating film, an oxide film to be a gate insulating film is formed and then a gate electrode made of polysilicon may be formed thereon. In this case, a film made of polysilicon is formed also on the main surface of the substrate opposite to the gate electrode (i.e., on the one main surface) to serve as the second detection film, thereby achieving a simplified manufacturing process.

The method for manufacturing the semiconductor device may further include the steps of: forming an electrode on the one main surface of the substrate; and removing the second detection film before the step of forming the electrode. In the case where the second detection film is formed on the main surface of the substrate on which the electrode is to be formed, it is preferable to remove the second detection film before forming the electrode.

In the method for manufacturing the semiconductor device, the substrate prepared in the step of preparing the substrate may have a diameter of 6 inches or greater. In the case where the substrate having a diameter of 6 inches or greater is employed, a manufacturing facility of single wafer processing type (manufacturing facility that processes substrates one by one) is frequently used in the manufacturing process of the semiconductor device. Further, in such a device of single wafer processing type, presence of a substrate is usually confirmed by applying light to the substrate. Hence, the method for manufacturing the semiconductor device in the present invention is particularly suitable in the case where a substrate having a diameter of 6 inches or greater is prepared in the step of preparing the substrate.

It should be noted that in consideration of the manufacturing process of the semiconductor device, a material for the detection film is selected under conditions that the material is stable at a high temperature (at least at approximately 500° C.), is unlikely to react with silicon carbide, and is unlikely to become corrosive by fluoric acid, SPM (Sulfuric Acid/Hydrogen peroxide mixture), aqua regia, alkali, or the like. It is preferable to employ a detection film made of silicon, carbon, or the like because they satisfies these conditions, are elements contained in silicon carbide, and are less likely to affect characteristics of the semiconductor device when introduced into the semiconductor device.

As apparent from the description above, according to the method for manufacturing the semiconductor device in the present invention, there can be provided a method for manufacturing a semiconductor device, which prevents increase of the facility cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
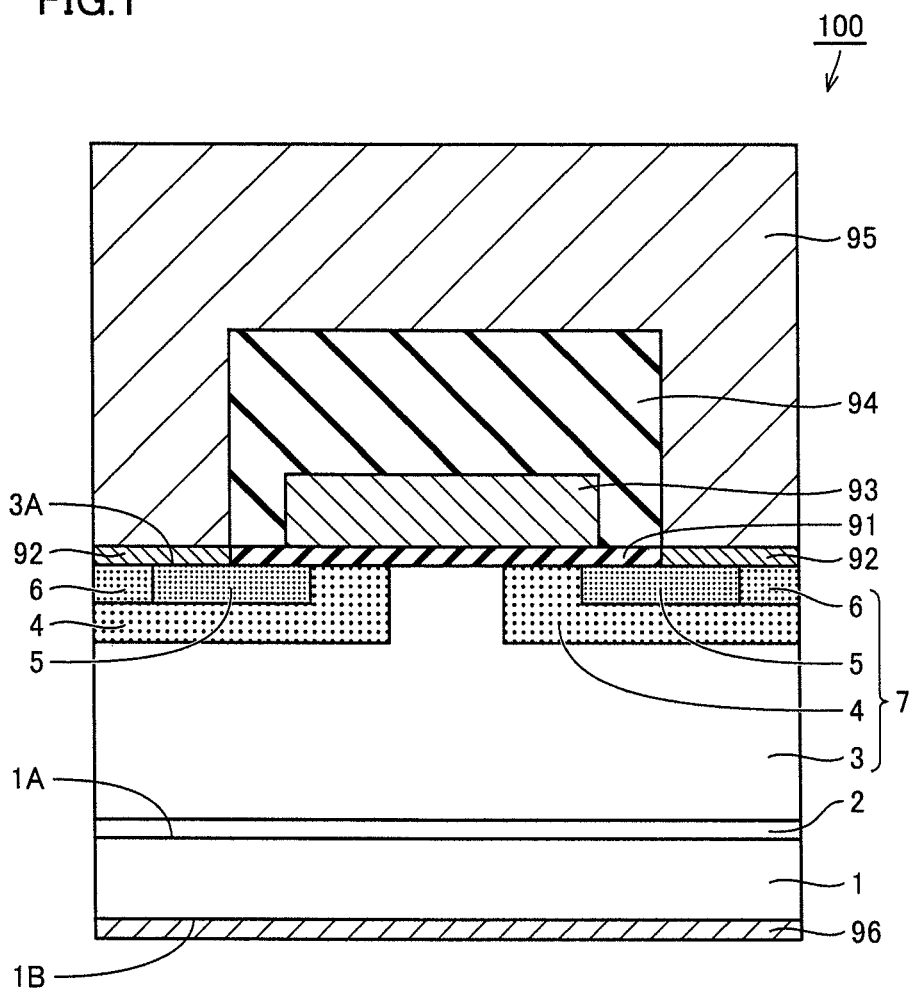
FIG. 1 is a schematic cross sectional view showing a structure of a semiconductor device of one embodiment of the present invention.

The following describes embodiments of the present invention with reference to figures. It should be noted that in the below-mentioned figures, the same or corresponding portions are given the same reference characters and are not described repeatedly. Further, in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification.

First Embodiment

First, a first embodiment, one embodiment of the present invention, will be described. Referring to FIG. 1, a MOSFET (Metal Oxide Semiconductor Field Effect Transistor) 100, which is one exemplary semiconductor device manufactured using a method for manufacturing a semiconductor device in the present invention, includes: a silicon carbide substrate 1 having n type conductivity (first conductivity type); a buffer layer 2 made of silicon carbide and having n type conductivity; a drift layer 3 made of silicon carbide and having n type conductivity; a pair of p type body regions 4 each having p type conductivity (second conductivity type); n$^+$ regions 5 each having n type conductivity; and p$^+$ regions 6 having p type conductivity.

Buffer layer 2 is formed on the other main surface 1A of silicon carbide substrate 1 opposite to one main surface 1B thereof, and contains an n type impurity and therefore has n type conductivity. Drift layer 3 is formed on buffer layer 2, and contains an n type impurity and therefore has n type conductivity. The n type impurity contained in drift layer 3 is, for example, N (nitrogen), and is contained therein at a concentration (density) lower than that of the n type impurity contained in buffer layer 2. Each of buffer layer 2 and drift layer 3 is an epitaxial growth layer formed on the other main surface 1A of silicon carbide substrate 1.

The pair of p type body regions 4 are formed in drift layer 3 to be separated from each other and include a main surface 3A of drift layer 3 opposite to its main surface at the silicon carbide substrate 1 side. Each of well regions 4 contains a p type impurity (impurity having p type conductivity) and therefore has p type conductivity. The p type impurity contained in each of p type body regions 4 is, for example, aluminum (Al), boron (B), or the like.

N$^+$ regions 5, which include main surface 3A, are surrounded by p type body regions 4 and are formed within the pair of p type body regions 4. Each of n$^+$ regions 5 contains an n type impurity such as P at a concentration (density) higher than that of the n type impurity contained in drift layer 3. P$^+$ regions 6, which include main surface 3A, are surrounded by p type body regions 4 and are formed adjacent to n$^+$ regions 5 within the pair of p type body regions 4 respectively. Each of p$^+$ regions 6 contains a p type impurity such as Al at a concentration (density) higher than that of the p type impurity contained in each of p type body regions 4. Drift layer 3, p type body regions 4, n$^+$ regions 5, and p$^+$ regions 6 constitute an active region 7.

Referring to FIG. 1, MOSFET 100 further includes: a gate oxide film 91 serving as a gate insulating film; a gate electrode 93; a pair of source contact electrodes 92; an interlayer insulating film 94; a source wire 95; and a drain electrode 96.

Gate oxide film 91 is formed on and in contact with main surface 3A of drift layer 3 so as to extend from a location on the upper surface of one n$^+$ region 5 to a location on the upper surface of the other n$^+$ region 5. Gate oxide film 91 is made of for example, silicon dioxide (SiO$_2$).

Gate electrode 93 is disposed in contact with gate oxide film 91 so as to extend from a location over one n$^+$ region 5 to a location over the other n$^+$ region 5. Further, gate electrode 93 is made of, for example, a conductor such as polysilicon.

Source contact electrodes 92 are disposed in contact with main surface 3A, extend from respective locations on the pair of n$^+$ regions 5 in the directions getting away from gate oxide film 91, and reach locations on p$^+$ regions 6. Further, each of source contact electrodes 92 is made of a material capable of ohmic contact with n$^+$ regions 5 such as Ni$_x$Si$_y$ (nickel silicide).

Interlayer insulating film 94 is formed to surround gate electrode 93 over main surface 3A of drift layer 3, and extend from a location over one p type body region 4 to a location over the other p type body region 4. Interlayer insulating film 94 is made of, for example, silicon dioxide (SiO$_2$), which is an insulator.

Source wire 95 surrounds interlayer insulating film 94 over main surface 3A of drift layer 3, and extends onto the upper surfaces of source contact electrodes 92. Source wire 95 is made of a conductor such as Al, and is electrically connected to n$^+$ regions 5 via source contact electrodes 92.

Drain electrode 96 is formed in contact with main surface 1B of silicon carbide substrate 1 opposite to the side at which drift layer 3 is formed. Drain electrode 96 is made of a material capable of ohmic contact with silicon carbide substrate 1, such as Ni$_x$Si$_y$. Drain electrode 96 is electrically connected to silicon carbide substrate 1.

The following describes operations of MOSFET 100. Referring to FIG. 1, when the drain electrode is fed with a voltage while gate electrode 93 has a voltage smaller than a threshold voltage, i.e., during the OFF state, a pn junction of p type body regions 4 and drift layer 3 just below gate oxide film 91 has a reverse bias. Accordingly, MOSFET 100 is in the non-conductive state. On the other hand, when gate electrode 93 is fed with a voltage equal to or greater than the threshold voltage, an inversion layer is formed in a channel region near locations at which p type body regions 4 make contact with gate oxide film 91. As a result, n$^+$ regions 5 and drift layer 3 are electrically connected to one another, whereby a current flows between source wire 95 and drain electrode 96.

Figure 2:
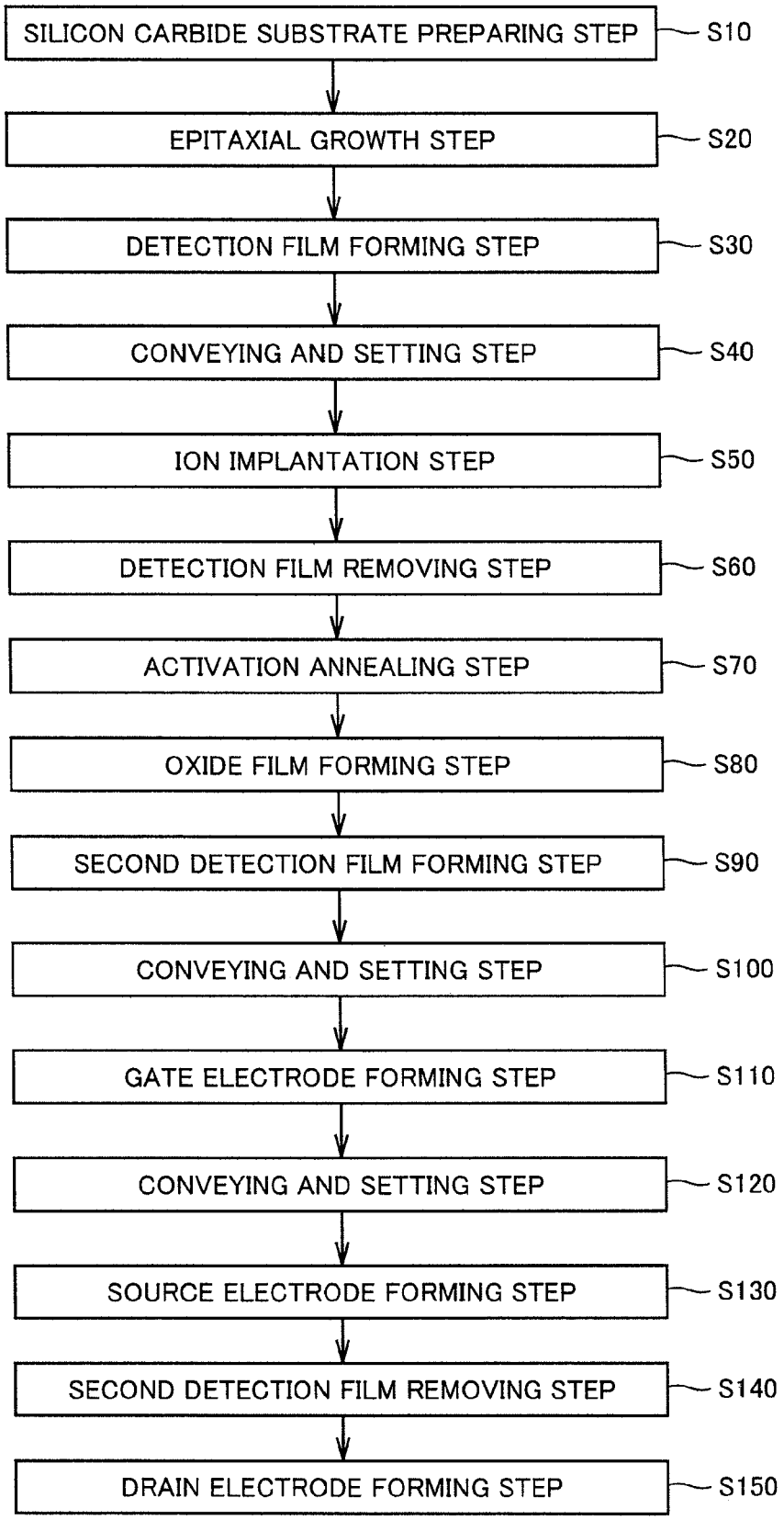
FIG. 2 is a flowchart schematically showing a manufacturing process of the semiconductor device in the first embodiment.
Figure 3:
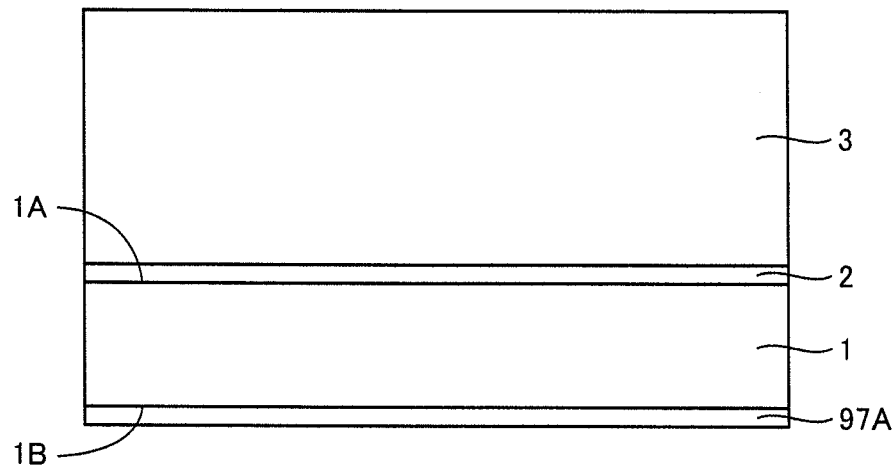
FIG. 3 is a schematic cross sectional view for illustrating the manufacturing process of the semiconductor device in the first embodiment.
Figure 4:
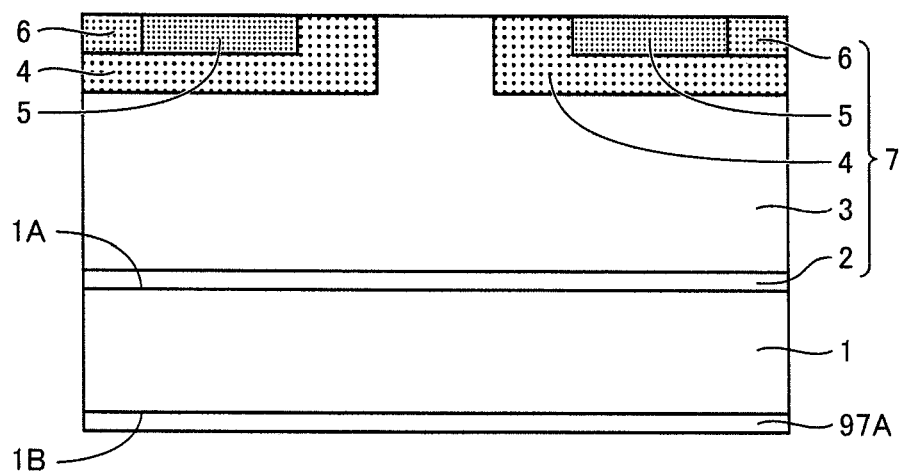
FIG. 4 is a schematic cross sectional view for illustrating the manufacturing process of the semiconductor device in the first embodiment.
Figure 5:
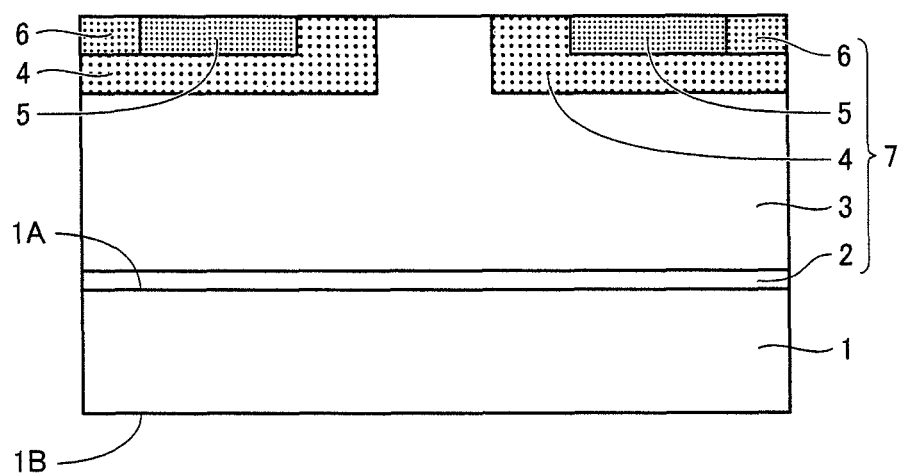
FIG. 5 is a schematic cross sectional view for illustrating the manufacturing process of the semiconductor device in the first embodiment.
Figure 6:
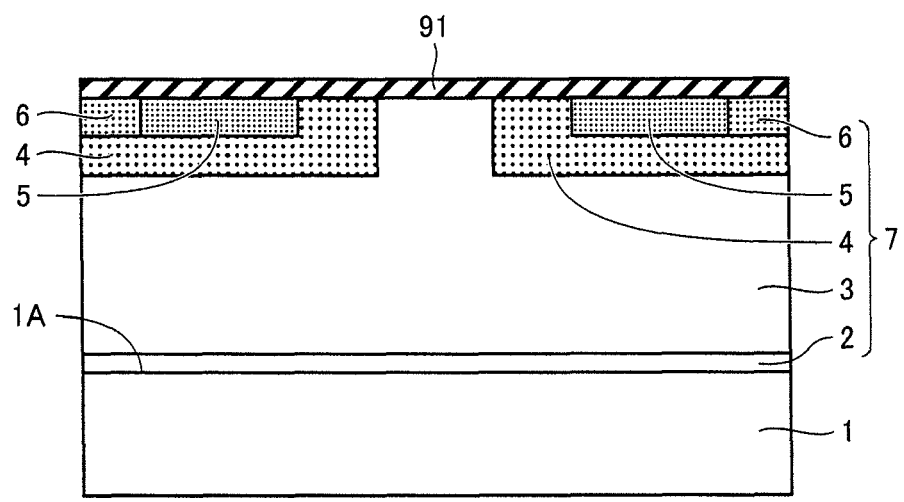
FIG. 6 is a schematic cross sectional view for illustrating the manufacturing process of the semiconductor device in the first embodiment.
Figure 7:
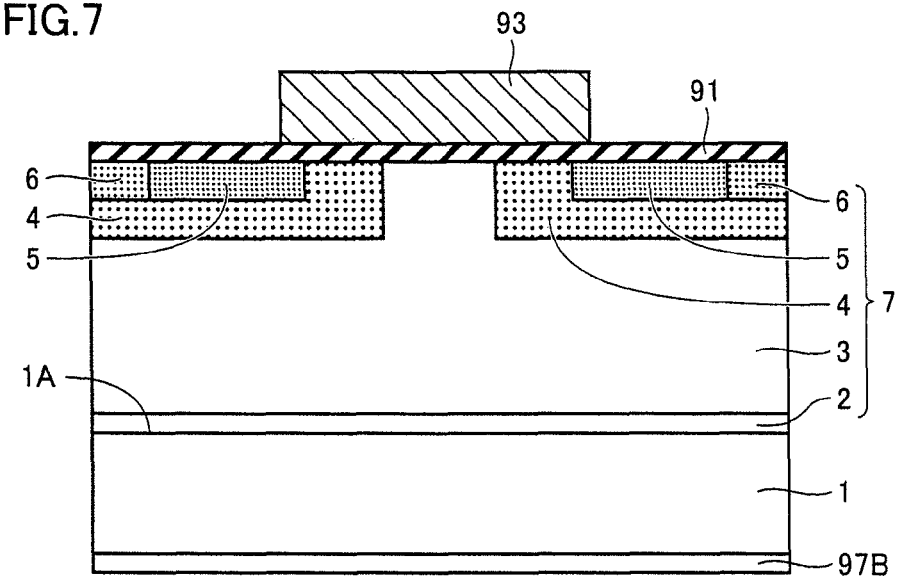
FIG. 7 is a schematic cross sectional view for illustrating the manufacturing process of the semiconductor device in the first embodiment.
Figure 8:
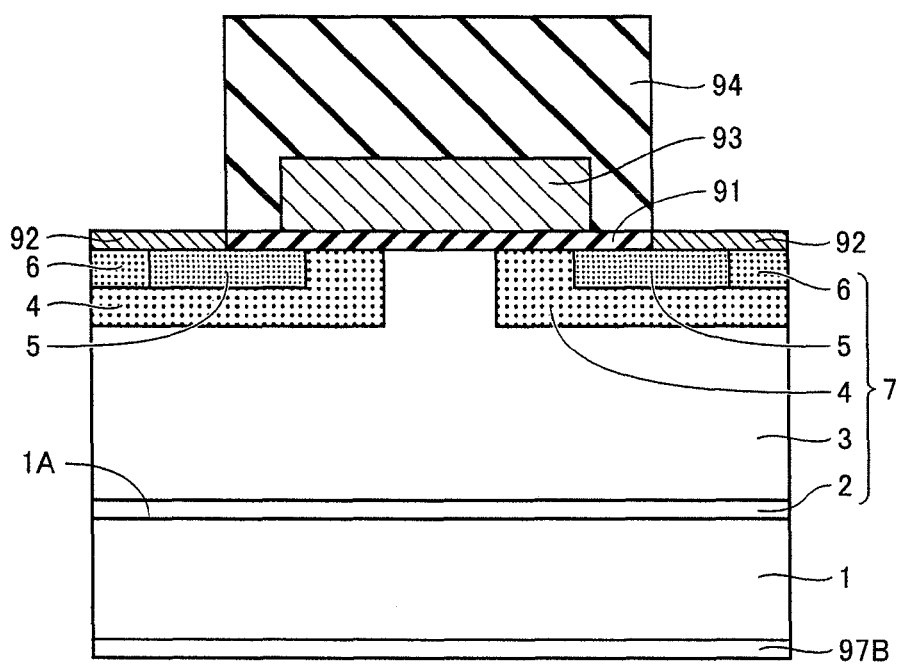
FIG. 8 is a schematic cross sectional view for illustrating the manufacturing process of the semiconductor device in the first embodiment.
Figure 9:
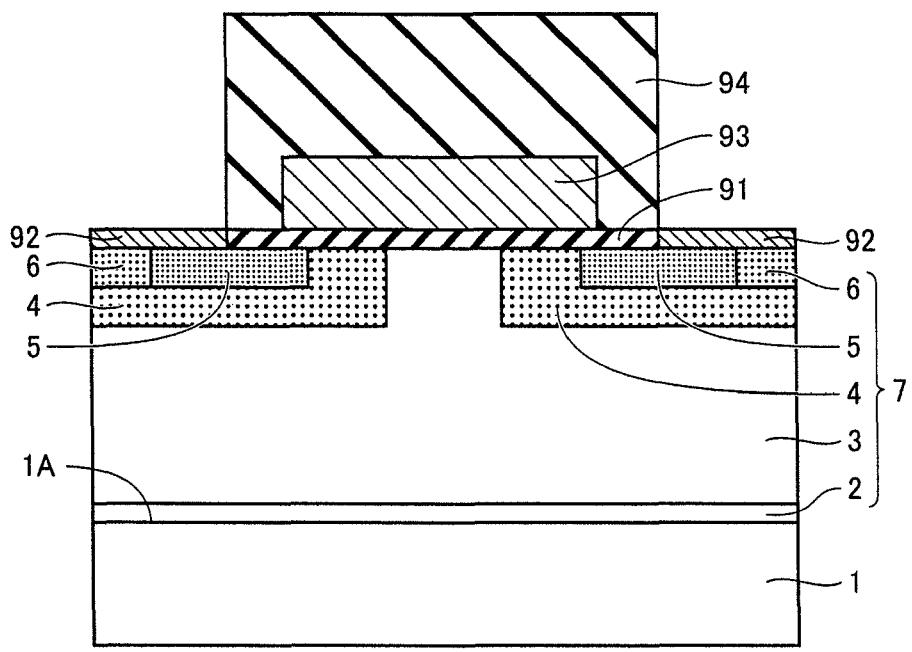
FIG. 9 is a schematic cross sectional view for illustrating the manufacturing process of the semiconductor device in the first embodiment.

The following describes one exemplary method for manufacturing MOSFET 100 in the first embodiment, with reference to FIG. 2-FIG. 9. Referring to FIG. 2, in the method for manufacturing MOSFET 100 in the present embodiment, a silicon carbide substrate preparing step is first performed as a step (S10). In this step (S10), referring to FIG. 3, for example, silicon carbide substrate 1 is prepared which is obtained by slicing a silicon carbide ingot formed by means of a sublimation method. Silicon carbide substrate 1 may have a diameter of 6 inches or greater.

Next, as a step (S20), an epitaxial growth step is performed. In this step (S20), referring to FIG. 3, buffer layer 2 and drift layer 3 each made of silicon carbide are sequentially formed on and over main surface 1A of silicon carbide substrate 1 by means of epitaxial growth. In this way, the step of preparing the substrate made of silicon carbide (epitaxial growth layer provided substrate) is completed.

Next, as a step (S30), a detection film forming step is performed. In this step (S30), referring to FIG. 3, a detection film 97A is formed on one main surface 1B of silicon carbide substrate 1. Detection film 97A has a light transmittance different from that of silicon carbide. Specifically, detection film 97A made of silicon is formed on main surface 1B of silicon carbide substrate 1. Detection film 97A can be formed by, for example, sputtering, evaporation, or the like. Further, in a subsequent step after forming detection film 97A, silicon carbide substrate 1 may be provided with a marker serving as a reference for positioning in silicon carbide substrate 1.

Next, as a step (S40), a conveying and setting step is performed. In this step (S40), silicon carbide substrate 1 having detection film 97A formed thereon in step (S30) is conveyed to and set in a device in which a below-described step (S50) is performed. On this occasion, detection film 97A is irradiated with light to confirm presence of silicon carbide substrate 1, thus securing conveyance and setting of silicon carbide substrate 1 to and in the device.

Next, as a step (S50), an ion implantation step is performed. In this step (S50), referring to FIG. 3 and FIG. 4, ion implantation is performed to form p type body regions 4, first. Specifically, for example, Al (aluminum) ions are introduced into drift layer 3, thereby forming p type body regions 4. Next, ion implantation is performed to form $n^+$ regions 5. Specifically, for example, P (phosphorus) ions are implanted into p type body regions 4, thereby forming $n^+$ regions 5 within p type body regions 4. Further, ion implantation is performed to form $p^+$ regions 6. Specifically, for example, Al ions are implanted into p type body regions 4, thereby forming $p^+$ regions 6 in p type body regions 4. The ions can be implanted using a mask layer formed on the main surface of drift layer 3, made of silicon dioxide ($SiO_2$), and having openings at desired regions for the ion implantations, for example.

Here, in each of the steps of forming the mask layer and performing the ion implantations, detection film 97A is irradiated with light to confirm the presence of silicon carbide substrate 1. Accordingly, silicon carbide substrate 1 is securely conveyed to and set in each device. In other words, step (S40) can be appropriately performed in step (S50).

Next, as a step (S60), a detection film removing step is performed. In step (S60), referring to FIG. 4 and FIG. 5, detection film 97A is removed. This avoids melting of detection film 97A made of silicon in a subsequent step (S70).

Next, as a step (S70), an activation annealing step is performed. In this step (S70), for example, heat treatment is performed by heating them to 1700° C. in an inert gas atmosphere such as argon for 30 minutes. Accordingly, the impurities implanted in the above-described step (S50) are activated.

Next, as a step (S80), an oxide film forming step is performed. In this step (S80), referring to FIG. 5 and FIG. 6, for example, heat treatment is performed by heating to 1300° C. in an oxygen atmosphere for 60 minutes, thereby forming oxide film (gate oxide film) 91.

Next, as a step (S90), a second detection film forming step is performed. In this step (S90), referring to FIG. 7, a second detection film 97B is formed on one main surface 1B of silicon carbide substrate 1. Second detection film 97B has a light transmittance different from that of silicon carbide. Second detection film 97B can be formed in the same manner as the formation of detection film 97A in step (S30) described above, but a detection film made of, for example, carbon may be formed using a method different from the method for forming detection film 97A.

Here, polysilicon may be employed as a material of second detection film 97B, and polysilicon films may be formed in step (S90) not only on one main surface 1B but also over the other main surface 1A (over gate oxide film 91). Accordingly, a subsequent step (S110) can be performed efficiently.

Next, as a step (S100), a conveying and setting step is performed. In this step (S100), silicon carbide substrate 1 having second detection film 97B formed thereon in step (S90) is conveyed to and set in a device in which a below-described step (S110) is performed. On this occasion, detection film 97B is irradiated with light to confirm presence of silicon carbide substrate 1, thus securely conveying and setting silicon carbide substrate 1 to and in the device.

Next, as a step (S110), a gate electrode forming step is performed. In this step (S110), referring to FIG. 7, gate electrode 93 made of for example polysilicon is formed on oxide film (gate oxide film) 91 formed in step (S80). On this occasion, in the case where the polysilicon film is also formed in step (S90) over the other main surface 1A (over gate oxide film 91), the polysilicon film is processed into a desired shape by etching or the like so as to form gate electrode 93 efficiently.

Here, in each of steps for processing the polysilicon film, detection film 97B is irradiated with light to confirm presence of silicon carbide substrate 1, thus securely conveying and setting silicon carbide substrate 1 to and in each device. In other words, step (S100) can be appropriately performed in step (S110).

Next, as step (S120), a conveying and setting step is performed. In this step (S120), silicon carbide substrate 1 is conveyed to and set in a device for performing a subsequent step (S130). On this occasion, detection film 97B is irradiated with light to confirm presence of silicon carbide substrate 1, thus securely conveying and setting silicon carbide substrate 1 to and in the device.

Next, as a step (S130), a source electrode forming step is performed. In this step (S130), referring to FIG. 7 and FIG. 8, an insulating film (for example, silicon dioxide film) to be interlayer insulating film 94 is formed to surround gate electrode 93 on oxide film 91. Next, portions of oxide film 91 and the insulating film located in the locations in which source contact electrode 92 are to be formed are removed by performing etching using, as a mask, a mask layer having openings at locations for formation of source contact electrodes 92. As a result, remaining oxide film 91 serves as gate oxide film 91 and the remaining insulating film serves as interlayer insulating film 94. Then, source contact electrodes 92 are formed on and in contact with active region 7 thus exposed (see FIG. 8). Source contact electrodes 92 are formed by forming nickel films on the desired locations and heating them for silicidation.

Here, in each of the step for processing oxide film 91 and the insulating film into gate oxide film 91 and interlayer insulating film 94 and the step for forming, at the desired locations, the nickel layers to be source contact electrode 92, detection film 97B is irradiated with light to confirm presence of silicon carbide substrate 1, thus securing normal conveyance and setting of silicon carbide substrate 1. In other words, step (S120) can be appropriately performed in step (S130).

Next, as a step (S140), a second detection film removing step is performed. In step (S140), referring to FIG. 8 and FIG. 9, second detection film 97B is removed. Detection film 97B can be removed by, for example, etching or the like. It should be noted that in the case where silicon carbide substrate 1 needs to have a small thickness, second detection film 97B may be removed by cutting it together with the silicon carbide substrate upon processing silicon carbide substrate 1 into the small thickness.

Next, as a step (S150), a drain electrode forming step is performed. In this step (S150), referring to FIG. 9 and FIG. 1, drain electrode 96 is formed on one main surface 1B of silicon carbide substrate 1. Drain electrode 96 can be formed by, for example, forming a nickel layer on main surface 1B and heating it for silicidation. Thereafter, formation of source wire 95 and the like are performed to complete MOSFET 100 shown in FIG. 1.

In the method for manufacturing the semiconductor device in the present embodiment, detection film 97A facilitating detection of the substrate is formed to confirm presence of the substrate, and active region 7 contributing to operations of the semiconductor device is formed in such a substrate. Accordingly, the substrate can be readily detected in a general manufacturing facility, thereby preventing increase of facility cost involved in modification of the facility.

Second Embodiment

The following describes another embodiment of the present invention, i.e., a second embodiment. A MOSFET 100, which is a semiconductor device in the second embodiment, has basically the same structure as that of the first embodiment and can be manufactured in basically the same way as in the first embodiment. However, the second embodiment is different from the first embodiment in terms of a part of the manufacturing process because a detection film made of carbon is employed in the manufacturing process of the second embodiment.

Figure 10:
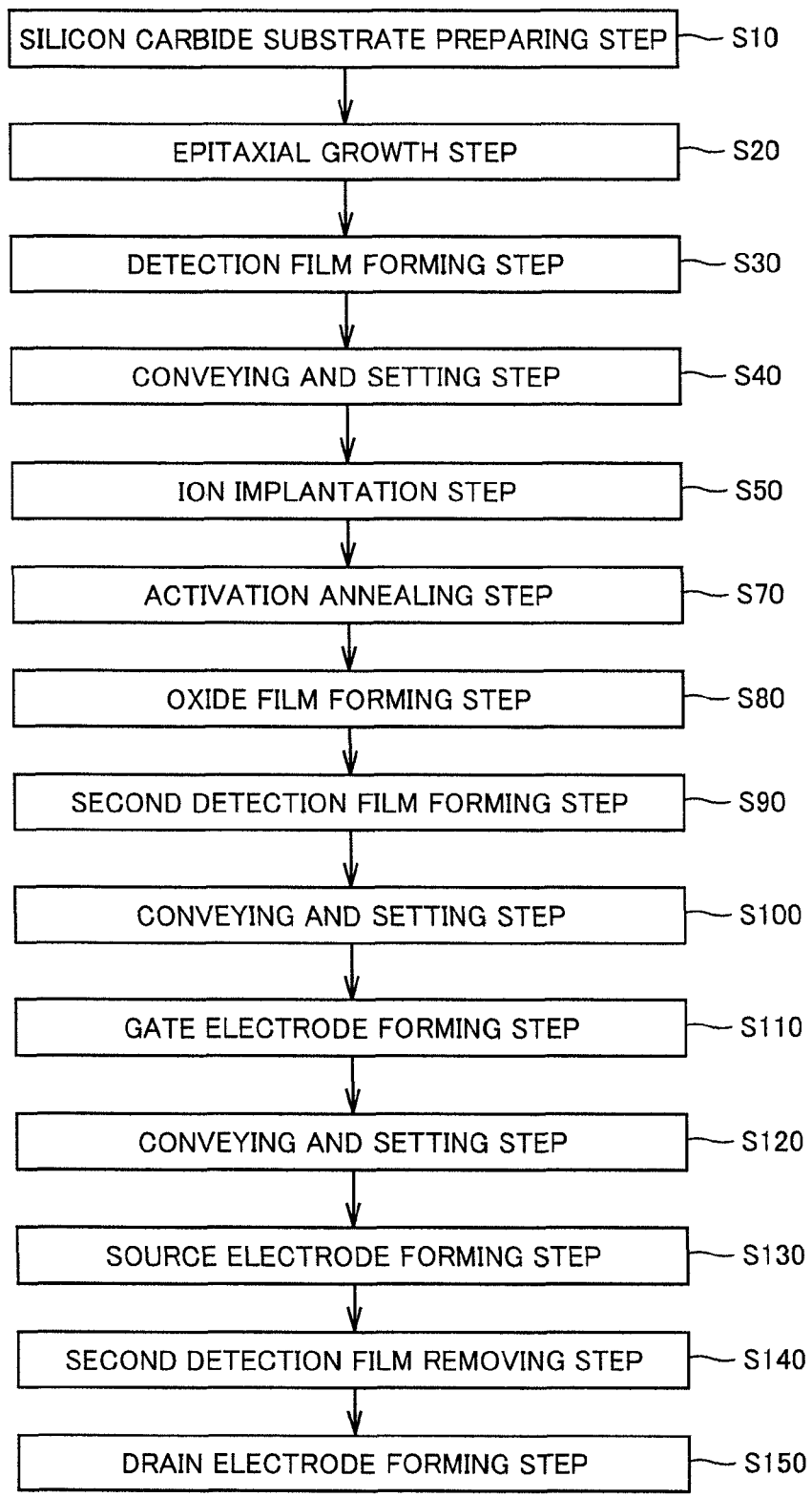
FIG. 10 is a flowchart schematically showing a manufacturing process of a semiconductor device in a second embodiment.
Figure 11:
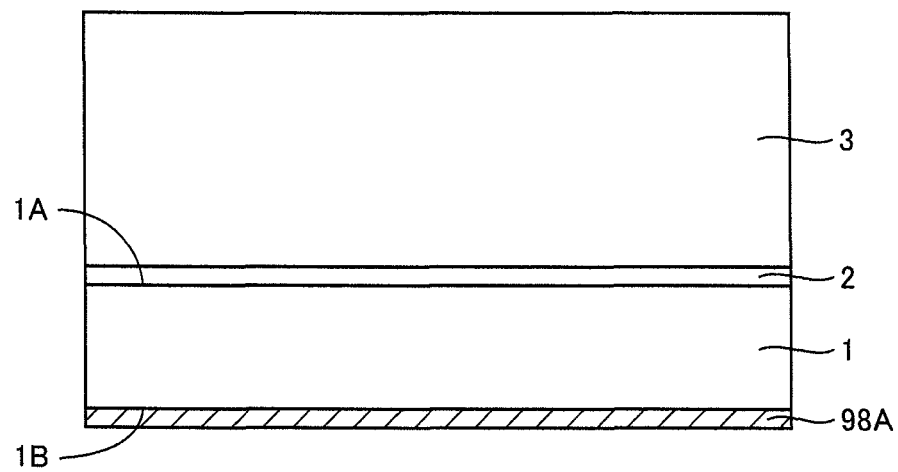
FIG. 11 is a schematic cross sectional view for illustrating the manufacturing process of the semiconductor device in the second embodiment.

Specifically, referring to FIG. 10, after performing steps (S10) and (S20) in the same way as in the first embodiment, a detection film 98A made of carbon is formed in step (S30) (see FIG. 11). Detection film 98A can be formed by a process including a step of forming an organic film on one main surface 1B of silicon carbide substrate 1, and a step of heating the organic film, for example. Specifically, for example, a resist is applied onto main surface 1B and is then heated in an inert gas atmosphere for carbonization, thereby forming detection film 98A made of carbon.

Figure 12:
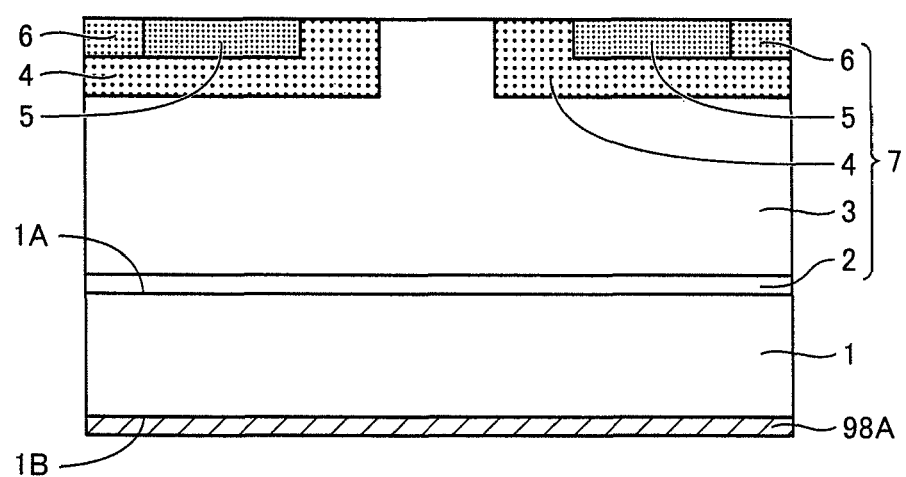
FIG. 12 is a schematic cross sectional view for illustrating the manufacturing process of the semiconductor device in the second embodiment.

Next, steps (S40) and (S50) are performed in the same way as in the first embodiment, thereby obtaining a structure shown in FIG. 12. In the first embodiment, detection film 97A is removed in step (S60) in order to prevent detection film 97A made of silicon from being melted in subsequent step (S70). In contrast, because detection film 98A of the second embodiment is not melted in step (S70), step (S60) is omitted and step (S70) is performed.

Figure 13:
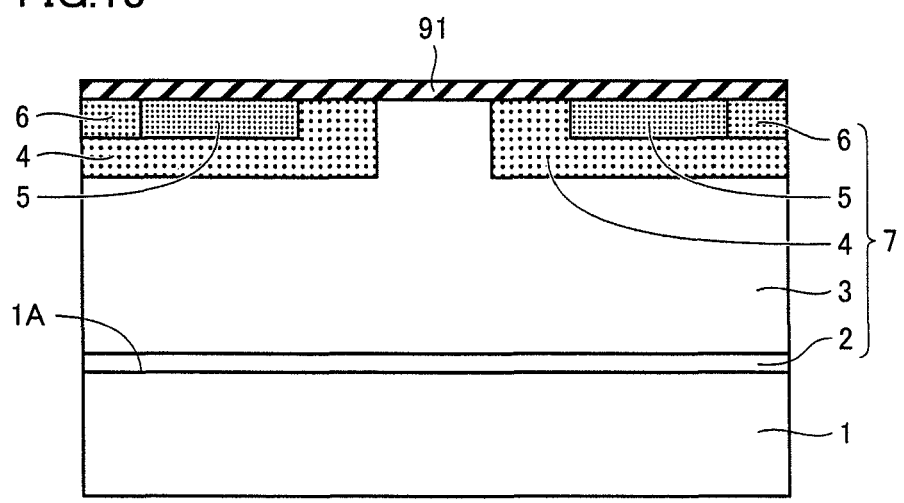
FIG. 13 is a schematic cross sectional view for illustrating the manufacturing process of the semiconductor device in the second embodiment.

Next, step (S80) is performed in the same way as in the first embodiment. Detection film 98A may be removed before step (S80) but, referring to FIG. 13, detection film 98A may be removed by the oxidation in thermal oxidation treatment performed in step (S80) to form oxide film (gate oxide film) 91. This reduces the number of steps, thereby reducing manufacturing cost of MOSFET 100.

Next, as step (S90), the second detection film forming step is performed. In this step (S90), a detection film made of carbon may be formed as with detection film 98A, but a detection film made of polysilicon may be formed to achieve efficient, subsequent formation of the gate electrode as described in the first embodiment. Thereafter, steps (S100)-(S150) are performed in the same manner as in the first embodiment, thereby completing the manufacturing of the semiconductor device of the present embodiment (MOSFET 100).

It has been illustrated in each of the foregoing embodiments that the MOSFET is manufactured using the method for manufacturing the semiconductor device in the present invention, but the method for manufacturing the semiconductor device in the present invention can be applied to various semiconductor devices employing silicon carbide substrates, such as an IGBT (Insulated Gate Bipolar Transistor), a JFET (Junction Field Effect Transistor), a diode, and the like.

The method for manufacturing the semiconductor device in the present invention is advantageously applicable to a method for manufacturing a semiconductor device, which is required to allow for reduced manufacturing facility cost.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device comprising the steps of:
   preparing a substrate made of silicon carbide;
   forming, on one main surface of said substrate, a detection film having a light transmittance different from that of silicon carbide;
   confirming presence of said substrate by applying light to said detection film under automated conveyance; and
   forming an active region in said substrate whose presence has been confirmed;
   wherein said detection film formed in the step of forming said detection film is made of silicon.

2. The method for manufacturing the semiconductor device according to claim 1, wherein:
   the step of forming said active region includes the steps of
      introducing an impurity into said substrate by means of ion implantation, and
      activating said impurity by heating said substrate having said impurity introduced therein, and
   the method for manufacturing the semiconductor device further comprising the steps of:
      removing said detection film before the step of activating said impurity; and
      forming, on said one main surface of said substrate, a second detection film having a light transmittance different from that of silicon carbide after the step of activating said impurity.

3. The method for manufacturing the semiconductor device according to claim 2, further comprising the step of forming an oxide film on the other main surface of said substrate after the step of forming said active region, wherein
   said second detection film formed on said substrate, having said oxide film thus formed, in the step of forming said second detection film is made of polysilicon.

4. The method for manufacturing the semiconductor device according to claim 2, further comprising the steps of:
   forming an electrode on said one main surface of said substrate; and
   removing said second detection film before the step of forming said electrode.

5. The method for manufacturing the semiconductor device according to claim 1, wherein said substrate prepared in the step of preparing said substrate has a diameter of 6 inches or greater.

6. A method for manufacturing a semiconductor device comprising the steps of:
   preparing a substrate made of silicon carbide;
   forming, on one main surface of said substrate, a detection film having a light transmittance different from that of silicon carbide;
   confirming presence of said substrate by applying light to said detection film under automated conveyance; and
   forming an active region in said substrate whose presence has been confirmed;
   wherein said detection film formed in the step of forming said detection film is made of carbon.

7. The method for manufacturing the semiconductor device according to claim 6, wherein:
   the step of forming said detection film includes the steps of
      forming an organic film on said one main surface of said substrate, and
      subjecting said organic film to heat treatment.

8. The method for manufacturing the semiconductor device according to claim 7, further comprising the steps of:
   forming an oxide film on the other main surface of said substrate after the step of forming said active region; and
   forming, on said one main surface of said substrate, a second detection film having a light transmittance different from that of silicon carbide after the step of forming said oxide film.

9. The method for manufacturing the semiconductor device according to claim 8, wherein said second detection film formed in the step of forming said second detection film is made of polysilicon.

10. The method for manufacturing the semiconductor device according to claim 8, further comprising the steps of:
   forming an electrode on said one main surface of said substrate; and
   removing said second detection film before the step of forming said electrode.

* * * * *